United States Patent
van Dal et al.

(10) Patent No.: US 11,586,885 B2
(45) Date of Patent: Feb. 21, 2023

(54) SYNAPSE-INSPIRED MEMORY ELEMENT FOR NEUROMORPHIC COMPUTING

(71) Applicant: Taiwan Semiconductor Manufacturing Co., Ltd., Hsin-Chu (TW)

(72) Inventors: Marcus Johannes Henricus van Dal, Linden (BE); Gerben Doornbos, Kessel-Lo (BE); Mauricio Manfrini, Leuven (BE)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 969 days.

(21) Appl. No.: 16/371,382

(22) Filed: Apr. 1, 2019

(65) Prior Publication Data
US 2020/0311524 A1   Oct. 1, 2020

(51) Int. Cl.
*G06N 3/06* (2006.01)
*G06N 3/063* (2023.01)
*G06N 3/04* (2023.01)
*G11C 13/00* (2006.01)
*G11C 11/54* (2006.01)
*B82Y 10/00* (2011.01)

(52) U.S. Cl.
CPC ........... *G06N 3/063* (2013.01); *G06N 3/04* (2013.01); *G11C 11/54* (2013.01); *G11C 13/0007* (2013.01); *B82Y 10/00* (2013.01)

(58) Field of Classification Search
CPC ......... G11C 11/52; G11C 11/56; G11C 11/48; G11C 11/5614
See application file for complete search history.

(56) References Cited

U.S. PATENT DOCUMENTS

| | | | | |
|---|---|---|---|---|
| 5,668,754 A | * | 9/1997 | Yamashita | G11C 11/5657 365/145 |
| 7,154,798 B2 | * | 12/2006 | Lin | G11C 11/1673 365/158 |
| 9,490,297 B1 | * | 11/2016 | Braganca | H01L 43/08 |
| 2003/0112655 A1 | * | 6/2003 | Hosotani | G11C 11/5607 365/158 |
| 2007/0091673 A1 | * | 4/2007 | Asao | G11C 11/16 365/171 |

(Continued)

OTHER PUBLICATIONS

Devolder et al. "Size Dependence of Nanosecond-Scale Spin-Torque Switching in Perpendicularly Magnetized Tunnel Junctions." American Physical Society, Physical Review B 93, 224432 (2016).

*Primary Examiner* — Han Yang
(74) *Attorney, Agent, or Firm* — Eschweiler & Potashnik, LLC

(57) ABSTRACT

Various embodiments of the present disclosure are directed towards a memory device including a first memory element and a second memory element. The memory device includes a substrate and a bottom electrode disposed over the substrate. The first memory element is disposed between the bottom electrode and a top electrode, such that the first memory element has a first area. A second memory element is disposed between the bottom electrode and the top electrode. The second memory element is laterally separated from the first memory element by a non-zero distance. The second memory element has a second area different than the first area.

20 Claims, 10 Drawing Sheets

(56) References Cited

U.S. PATENT DOCUMENTS

2012/0134200 A1* 5/2012 Khoueir .............. G11C 11/5607
  365/158
2018/0350875 A1* 12/2018 Han .................. H01L 23/53295

* cited by examiner

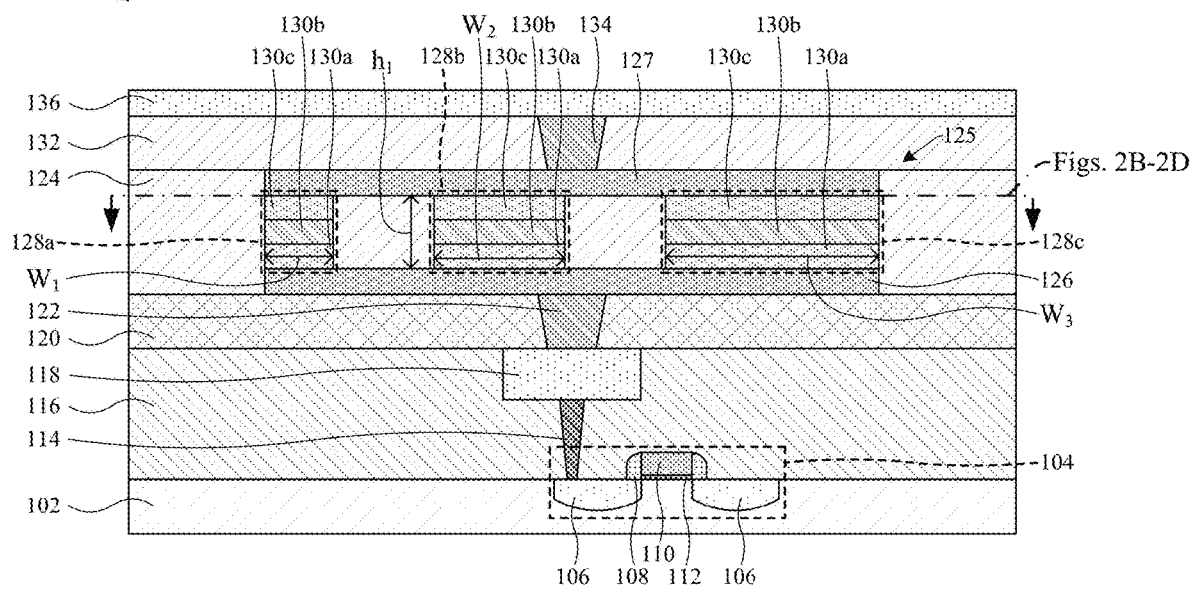
Fig. 1D
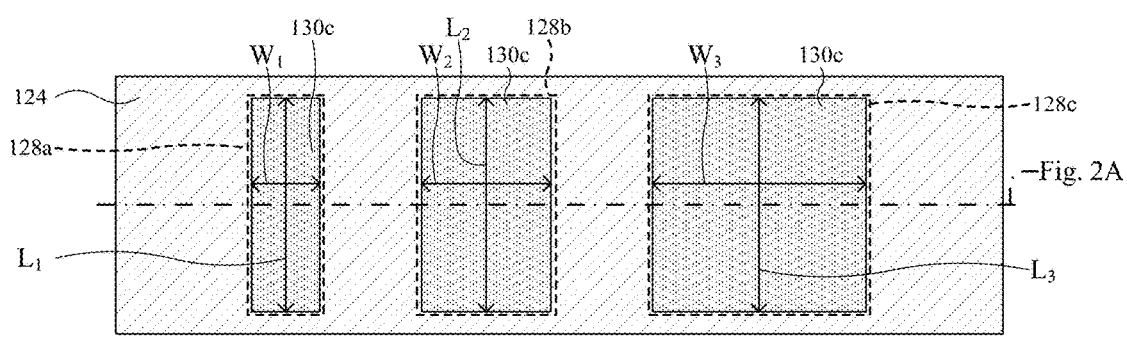
Fig. 2A
Fig. 2B

200f

| Voltage Range (V) | $R_1$ (Ω) | $R_2$ (Ω) | $R_3$ (Ω) | $R_{total}$ (Ω) | G (µS) |
|---|---|---|---|---|---|
| Under -0.4 | 5000 | 3750 | 2500 | 1154 | 867 |
| 0.2 to 0.3 | 5000 | 3750 | 1000 | 682 | 1467 |
| 0.3 to 0.4 | 5000 | 1500 | 1000 | 536 | 1867 |
| Over 0.4 | 2000 | 1500 | 1000 | 462 | 2167 |

Fig. 2F

SYNAPSE-INSPIRED MEMORY ELEMENT FOR NEUROMORPHIC COMPUTING

BACKGROUND

Many modern-day electronic applications, such as data mining of big data or image recognition for autonomous driving, utilize deep neural networks that use vast amounts of computation power. The deep neural networks are often implemented on neuromorphic computing chips that emulate the human brain, where a digital representation of neurons are programmed in weight values (e.g., the digital neuron may have 4 weight values) much like a neuron in the human brain.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1D illustrates a table corresponding to some embodiments of an operation of the memory device of FIG. 1A.

FIG. 2A illustrates a cross-sectional view of some embodiments of a memory device including a memory cell with three memory elements with different sizes.

FIGS. 2B-2D illustrate various embodiments of a top view of the memory device of FIG. 2A, as indicated by the cut-line in FIG. 2A.

FIG. 2F illustrates a table corresponding to some embodiments of an operation of the circuit diagram of FIG. 2E.

DETAILED DESCRIPTION

Figure 1A:
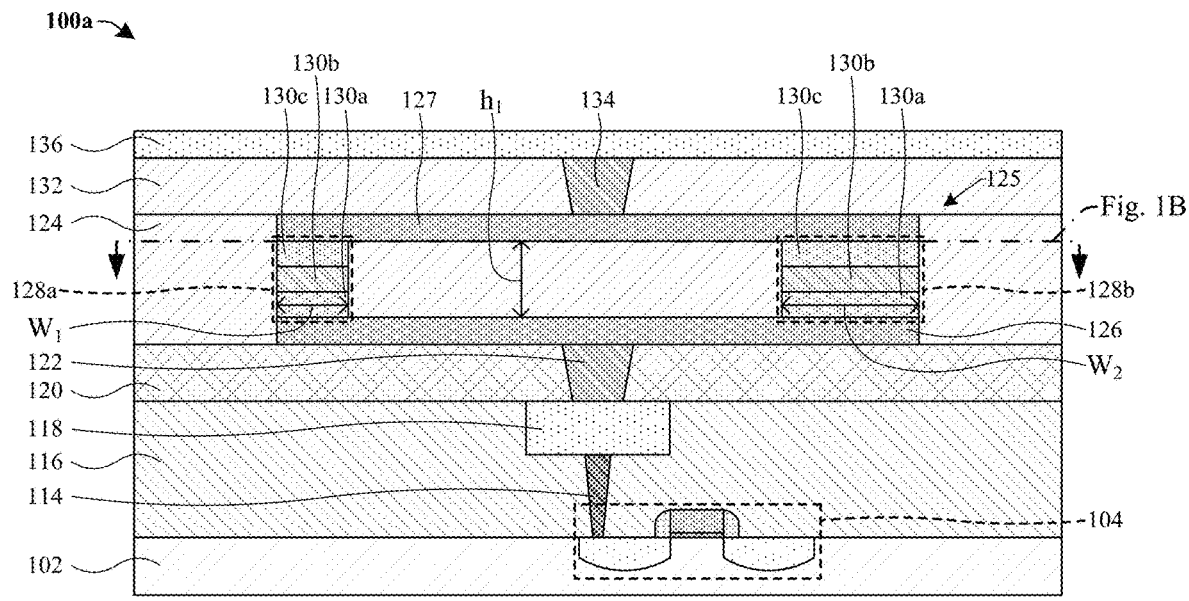
FIG. 1A illustrates a cross-sectional view of some embodiments of a memory device including a memory cell configured to have three or more distinct resistances corresponding to different synaptic weights of a neuromorphic computing system.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some next generation memory applications comprise brain-inspired neuromorphic computing chips, which loosely mimic neuro-biological architectures present in nervous systems. Deep neural networks may be implemented on a neuromorphic computing chip. In traditional computing, a computer is given explicit instructions on how to perform a task and/or solve a problem based on a set of written commands and/or a set of inputs. Conversely, in a deep neural network, the neuromorphic computing chip is not given explicit instructions on how to solve a problem. Rather, the neuromorphic computing chip is able to train itself based on observational data (i.e., training data), whereby the neuromorphic computing chip may determine a solution to the problem that was not provided by pre-written code.

In order to determine the solution, the neuromorphic computing chip emulates the human brain, where a digital representation of neurons are programmed in weight values (e.g., the digital neuron may have 4 weight values) much like a neuron in the human brain. The digital neurons interact with adjacent (or neighboring) digital neurons over the weight values connecting the digital neurons. In a deep neural network, the weight values of each individual element may be changed while training over the observational data to decrease an error in the deep neural network. An accuracy and/or efficiency of the deep neural network may depend upon the observational data and/or the number of available weight values (i.e., more accurate observational data and/or a greater number of available weight values may increase the accuracy and/or efficiency of the deep neural network). Therefore, a digital neuron with a greater number of weight values may decrease an error in the deep neural network more efficiently and accurately than a digital neuron with a lower number of weight values.

In traditional complementary metal-oxide semiconductor (CMOS) technology, weight values for a digital neuron may be achieved by individual memory cells. In some implementations, a weight value for a digital neuron may be set by resistance value, for example, a high resistance value results in a lower weight in the deep neural network, whereas a low resistance value results in a higher weight in the deep neural network. However, the weight value of the digital neuron may change while training the deep neural network, and therefore a CMOS technology with multiple resistances states is advantageous. For example, a digital neuron implemented with a traditional resistive random-access memory (RRAM) cell may have 2 weight values (i.e., 2 resistance states—a binary state of "0" and a binary state of "1"). However, a digital neuron implemented with 2 available weight values will have a limited ability to decrease error in the deep neural network, thereby decreasing an accuracy and/or efficiency of the deep neural network.

In some embodiments of the present disclosure, a memory cell that is able to achieve three or more distinct resistances (corresponding to different synaptic weights) may be formed. In such an embodiment, a stack of memory cell layers are formed over a bottom electrode and a masking layer is formed over the stack of memory cell layers. An etch process is performed according to the masking layer to define N (N is a whole number greater than 1) memory elements over the bottom electrode. A top electrode is formed over the N memory elements. The memory elements respectively have a different area (i.e., each memory element has a same height value, but has a length and/or a width different than any other memory element in the N memory elements). The different areas of the memory elements facilitate each memory element having a different threshold voltage. The different threshold voltages allow for the memory cell to be biased in a manner that allows the memory cell to achieve N+1 different combinations of resistive states corresponding to N+1 different synaptic weights. This new method increases the number of available synaptic weight values for a digital neuron, thereby increasing an accuracy and efficiency of the deep neural network.

Referring to FIG. 1A, a cross-sectional view of a memory device 100a including a memory cell 125 configured to have three or more distinct resistances corresponding to different synaptic weights for a neuromorphic computing system is provided.

The memory device 100a includes the memory cell 125 over a semiconductor substrate 102. An inter-level dielectric (ILD) structure 116 comprising one or more ILD materials is disposed over the semiconductor substrate 102. An access device 104 (e.g., a transistor, a diode, etc.) is within the semiconductor substrate 102 and the ILD structure 116. The memory cell 125 is electrically coupled to the access device 104 via a conductive contact 114 and an interconnect wire 118. A dielectric layer 120 is disposed between the memory cell 125 and the ILD structure 116. A bottom electrode via 122 is disposed between the interconnect wire 118 and the memory cell 125.

The memory cell 125 includes a bottom electrode 126, memory elements 128a, 128b, and a top electrode 127. The memory cell 125 is disposed within a first inter-metal dielectric (IMD) structure 124. In some embodiments, the first IMD structure 124 may comprise one or more IMD materials. The memory elements 128a, 128b are disposed between the bottom electrode 126 and the top electrode 127 and are electrically coupled in parallel with one another. In some embodiments, the memory elements 128a, 128b comprise a stack of memory layers 130a-c, respectively. For example, the memory elements 128a, 128b may be spin-transfer torque magnetoresistive random-access memory (STT-MRAM) cells having a lower ferromagnetic electrode 130a and an upper ferromagnetic electrode 130c, which are separated from one another by a tunneling barrier layer 130b. A top electrode via 134 overlies the top electrode 127 and provides electrical coupling to the memory cell 125 from overlying conductive layers, such as a conductive wire 136. A second IMD structure 132 comprising one or more IMD materials overlies the top electrode 127. The top electrode via 134 extends from the conductive wire 136 through the second IMD structure 132 to the top electrode 127.

In some embodiments, the first and second memory elements 128a, 128b have a height $h_1$ that may, for example, be within a range of approximately 400-2,000 nanometers. In further embodiments, a height of the first memory element 128a is approximately equal to a height of the second memory element 128b. The first memory element 128a has a first width $W_1$ that may, for example, be 50 nanometers or within a range of approximately 30-70 nanometers. The second memory element 128b has a second width $W_2$ that may, for example, be 250 nanometers or within a range of approximately 230-270 nanometers. In some embodiments, the first width $W_1$ is different from the second width $W_2$.

The different widths of the first and second memory elements 128a, 128b provide the first and second memory elements 128a, 128b with different areas, different threshold voltages, and different maximum and/or minimum resistances (e.g., different resistances in a parallel state and/or different resistances in an anti-parallel state). For example, the first memory element 128a has a first threshold voltage based on the first width $W_1$ (i.e., based on an area of the first memory element 128a as viewed from a top of the first memory element 128a). The second memory element 128b has a second threshold voltage based on the second width $W_2$ (i.e., based on an area of the second memory element 128b as viewed from a top of the second memory element 128b). In some embodiments, the first and second threshold voltages are different. For example, the first threshold voltage may be 0.4 volts (V) and the second threshold voltage may be 0.2V. In some embodiments, when the first width $W_1$ is less than the second width $W_2$ (i.e., an area of the second memory element 128b is greater than an area of the first memory element 128a), the second threshold voltage is less than the first threshold voltage because a resistance of the first memory element 128a is greater than a resistance of the second memory element 128b. This, in part, is because current may more easily flow through a conductor with a greater area.

The different threshold voltages of the first and second memory elements 128a, 128b cause the first and second memory elements 128a, 128b to respectively change between a parallel state and an anti-parallel state at different applied voltages. For example, applying a first voltage (e.g., 0.40V or greater) across the first memory element 128a may set the first memory element 128a to the parallel state (e.g., a binary state of "1") and applying a second voltage (e.g., −0.40V or less) across the first memory element 128a may set the first memory element 128a to the anti-parallel state (e.g., a binary state of "0"). Further, applying a third voltage (e.g., 0.20V or greater) across the second memory element 128b may set the second memory element 128b to the parallel state (e.g., a binary state of "1") and applying a fourth voltage (e.g., −0.20V or less) may set the second memory element 128b to the anti-parallel state (e.g., a binary state of "0").

The parallel and anti-parallel states provide the first and second memory elements 128a, 128b with different resistances. For example, a first parallel resistance (e.g., resistance of a memory element while in the parallel state) of the first memory element 128a may, for example, be approximately 2,000 ohms and a first anti-parallel resistance (e.g., resistance of a memory element while in the anti-parallel state) of the first memory element 128a may, for example, be approximately 5,000 ohms. A second parallel resistance of the second memory element 128b may, for example, be approximately 1,000 ohms and a second anti-parallel resistance of the second memory element 128b may, for example, be approximately 2,500 ohms. Therefore, the first and second memory elements 128a, 128b have different threshold voltages with different resistive values while in the parallel and anti-parallel states, respectively.

During an operation of the memory device 100a, a bias voltage may be applied across the top and bottom electrodes 127, 126. The bias voltage causes the first and second memory elements 128a, 128b to change between different combinations of parallel and anti-parallel states. The different combinations of parallel and anti-parallel states allow the memory cell 125 to achieve three different parallel resistances that correspond to three different synaptic weights for a neuromorphic computing system. Thus, the memory cell 125 is able to store three different weight values.

For example, in some embodiments described in table 100d of FIG. 1D, a first bias voltage of approximately −0.45 V may be applied across the top and bottom electrodes 127, 126. The first bias voltage sets the first and second memory elements 128a, 128b to the anti-parallel state (e.g., a binary state of "0", respectively) and the memory cell 125 is set to a first weight value (i.e., reset to a binary state of "00" with a resistance of 1,667 ohms) over a switching time G of approximately 600 microseconds (μS). Further, a second bias voltage of approximately 0.25 V may be applied across the top and bottom electrodes 127, 126. The second bias voltage sets the second memory element 128b to the parallel state (e.g., a binary state of "1"), the first memory element 128a to the anti-parallel state, and the memory cell 125 to a second weight value (i.e., binary state of "01" with a resistance of 833 ohms) over a switching time G of approximately 1200 μS. Furthermore, a third bias voltage of approximately 0.45 V may be applied across the top and bottom electrodes 127, 126. The third bias voltage sets the first memory element 128a to the parallel state (e.g., a binary state of "1"), the second memory element 128b to the parallel state, and the memory cell 125 to a third weight value (i.e., binary state of "11" with a resistance of 667 ohms) over a switching time G of approximately 1500 μS.

Thus, during operation of the memory device 100a, the memory cell 125 may achieve 3 different resistances (i.e., 667 ohms, 833 ohms, and 1,667 ohms) that correspond to 3 weight values for neuromorphic computing. Therefore, by keeping the memory layers 130a-c and the height $h_1$ of the first and second memory elements 128a, 128b the same and varying the first and second widths $W_1$, $W_2$ the memory cell 125 may function as a multi-weight memory cell. Thus, a multi-weight memory cell may be disposed within a single metal level design (e.g., the first and second memory elements 128a, 128b are on a same vertical level of the memory device 100a), thereby increasing a number of weight values (i.e., resistance values) of the memory device 100a.

In some embodiments, the memory cell 125 may comprise any number of memory elements. For example, the memory cell 125 may comprise N (N is a whole number greater than 1) memory elements such that the areas of the N memory elements are different from one another, thus the threshold voltages of the N memory elements are different from one another. Therefore, the memory cell 125 may have N+1 weight values (i.e., N+1 resistance states).

Figure 1B:
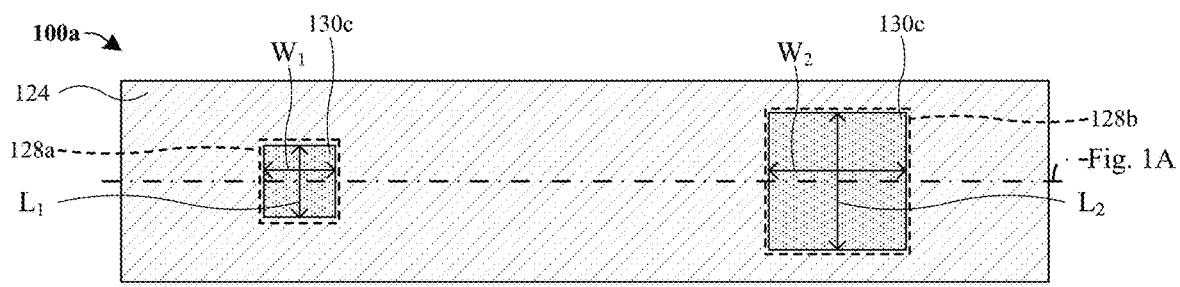
FIG. 1B illustrates some embodiments of a top view of the memory device of FIG. 1A, as indicated by the cut-line in FIG. 1A.

Referring to FIG. 1B, some embodiments of a top view of the memory device 100a of FIG. 1A as indicated by the cut-away lines shown in FIGS. 1A and 1B is provided.

The first memory element 128a has a first length $L_1$. In some embodiments, the first length $L_1$ is equal to the first width $W_1$. The second memory element 128b has a second length $L_2$. In further embodiments, the second length $L_2$ is equal to the second width $W_2$. Thus, the first memory element 128a has a first area (e.g., the first area equals the first length $L_1$ times the first width $W_1$) that is less than a second area of the second memory element 128b (e.g., the second area equals the second length $L_2$ times the second width $W_2$). The first threshold voltage of the first memory element 128a is based upon the first area and the second threshold voltage of the second memory element 128b is based upon the second area. For example, a memory element with a greater area will have a lower threshold voltage than a memory element with a smaller area because current may more easily flow through a conductor with a greater area.

Figure 1C:
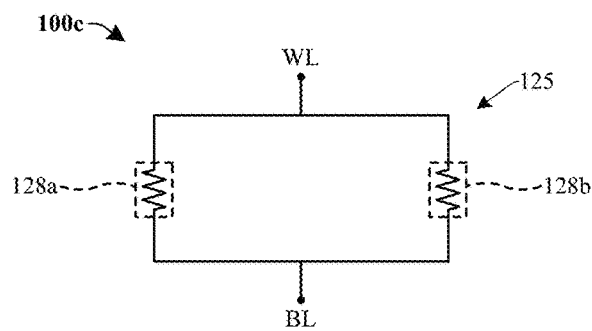
FIG. 1C illustrates a circuit diagram of some embodiments of the memory device of FIG. 1A.

Referring to FIG. 1C, some embodiments of a circuit diagram 100c of the memory device 100a of FIG. 1A is provided.

The circuit diagram 100c represents some embodiments of operating the memory device 100a of FIG. 1A. In some embodiments, the first and second memory elements 128a, 128b may be represented as resistors with variable resistance that are electrically coupled in parallel with one another. During operation of the circuit diagram 100c a bias voltage may be applied between a bit line (BL) (e.g., the interconnect wire 118 of FIG. 1A) and a word line (WL) (e.g., the conductive wire 136 of FIG. 1A) to read and/or write the first and second memory elements 128a, 128b. In some embodiments, the BL and WL may be a part of a cross-point memory array.

Although FIGS. 1A-1D describe the memory elements 128a, 128b as being magnetoresistive random-access memory (MRAM) cells, it will be appreciated that the memory elements 128a, 128b are not limited to such devices. Rather, in alternative embodiments, the memory elements 128a, 128b may comprise phase-change random-access memory (PCRAM) cells, resistive random-access memory (RRAM) cells, conductive bridging random-access memory (CBRAM) cells, or the like. In such embodiments, the memory elements 128a, 128b can be formed to have different threshold voltages (e.g., different voltages at which the memory elements 128a, 128b change between high resistive states and low resistive states).

Referring to FIG. 2A, a memory device 200a corresponding to some alternative embodiments of the memory device 100a of FIG. 1A in which the memory cell 125 comprises a first memory element 128a, a second memory element 128b, and a third memory element 128c is provided.

The memory device 200a includes the memory cell 125 over a semiconductor substrate 102. The memory cell 125 is electrically coupled to the access device 104 via a conductive contact 114 and an interconnect wire 118. In some embodiments, the access device 104 may comprise an access transistor and may be used to perform a read and/or a write operation on the memory cell 125. In the aforementioned embodiment, the access device 104 comprises source/drain regions 106, sidewall spacers 108, a gate electrode 110, and a gate dielectric 112. The gate electrode 110 overlies the gate dielectric 112 and may be biased with a voltage to control a conductive channel within the semiconductor substrate 102 between the source/drain regions 106. The sidewall spacers 108 abut outer sidewalls of the gate electrode and dielectric 110, 112 and overlie the source/drain regions 106. In some embodiments, the source/drain regions 106 are doped regions of the semiconductor substrate 102.

In some embodiments, the gate electrode 110 may be biased to perform a read and/or write operation on the memory cell 125.

The first, second, and third memory elements 128a, 128b, 128c comprise a stack of memory layers 130a-c, respectively. In some embodiments, the first, second, and third memory elements 128a, 128b, 128c are spin-transfer torque magnetoresistive random-access memory (STT-MRAM) cells, such that the stack of memory layers 130a-c include a lower ferromagnetic electrode 130a and an upper ferromagnetic electrode 130c, which are separated from one another by a tunneling barrier layer 130b. In further embodiments, the first, second, and third memory elements 128a, 128b, 128c have a tunnel magnetoresistance (TMR) of 150 percent, respectively. In some embodiments, the lower ferromagnetic electrode 130a can have a fixed or "pinned" magnetic orientation, while the upper ferromagnetic electrode 130c has a variable or "free" magnetic orientation, which can be switched between two or more distinct magnetic polarities (e.g., parallel (P) and anti-parallel (AP)) that each represents a different data state (i.e., a low or high resistance state and/or different binary state such as "1" or "0"). In other implementations, however, the stack of memory layers 130a-c can be vertically "flipped", such that the lower ferromagnetic electrode 130a has a "free" magnetic orientation, while the upper ferromagnetic electrode 130c has a "pinned" magnetic orientation.

For example, for a memory element in a parallel state, a magnetic orientation of the lower ferromagnetic electrode 130a is identical to a magnetic orientation of the upper ferromagnetic electrode 130c, thus a resistance across the memory element is low and a binary state of the memory element may be high (e.g., "1"). In yet another example, in an anti-parallel state the magnetic orientation of the lower ferromagnetic electrode 130a is opposite to the magnetic orientation of the upper ferromagnetic electrode 130c, thus a resistance across the memory element is high and a binary state of the memory element may be low (e.g., "0").

The first, second, and third memory elements 128a, 128b, 128c have a height $h_1$ that may, for example, be within a range of approximately 400-2000 nanometers. In some embodiments, a height of the first memory element 128a is approximately equal to a height of the second memory element 128b and the height of the first memory element 128a is approximately equal to a height of the third memory element 128c. The first memory element 128a has a first width $W_1$ that may, for example, be 50 nanometers or within a range of approximately 30-70 nanometers. The second memory element 128b has a second width $W_2$ that may, for example, be 120 nanometers or within a range of approximately 100 to 140 nanometers. The third memory element 128c has a third width $W_3$ that may, for example, be 250 nanometers or within a range of approximately 230-270 nanometers. In some embodiments, the first width $W_1$ is different than the second and third widths $W_2$, $W_3$ and the second width $W_2$ is different than the third width $W_3$. The first, second, and third memory elements 128a, 128b, 128c have threshold voltages (e.g., an absolute voltage value that may change a resistance value of the memory element) different from one another, such that a respective threshold voltage is based on the width of the respective memory element (i.e., based on an area of the respective memory element). For example, first, second, and third memory elements 128a, 128b, 128c may have threshold voltages of 0.4 V, 0.3 V, and 0.2 V, respectively. Thus, by varying an area of the 3 memory elements (the first, second, and third memory elements 128a, 128b, 128c) the memory cell 125 has 4 weight values (i.e., 4 resistance states), thereby increasing a number of available weight values in the memory device 200a.

Referring to FIG. 2B, some embodiments of a top view of the memory device 200a of FIG. 2A as indicated by the cut-away lines shown in FIGS. 2A and 2B is provided.

The first, second, and third memory elements 128a, 128b, 128c have lengths $L_1$, $L_2$, and $L_3$, respectively. In some embodiments, the lengths $L_1$, $L_2$, and $L_3$ are approximately equal with one another. Thus, the first, second, and third memory elements 128a, 128b, 128c have first, second, and third areas (e.g., the first area equals a first length $L_1$ times the first width $W_1$, the second area equals a second length $L_2$ times the second width $W_2$, etc.), respectively. The first, second, and third areas are different from one another. In some embodiments, for example, the first area is less than the second area and the second area is less than the third area. The difference in the area of each memory element facilitates the first, second, and third memory elements 128a, 128b, 128c having threshold voltages that are different from one another. This, in part, is because a resistance value of a memory element with a smaller area is greater than a resistance value of a memory element with a larger area, therefore a larger threshold voltage may be used to change a resistive state of the memory element with the smaller area.

It may be appreciated that the first, second, and third memory elements 128a, 128b, 128c may have any shape when viewed from above, such that the rectangular shapes in the top view of FIG. 2A is merely a non-limiting example. For example, first, second, and third memory elements 128a, 128b, 128c may be circular, elliptical, square, another suitable shape, or any combination of the aforementioned, such that first, second, and third areas (of the first, second, and third memory elements 128a, 128b, 128c, respectively) are different from one another. For example, if the shapes are circular and/or elliptical, the lengths $L_1$, $L_2$, and $L_3$ and/or the widths $W_1$, $W_2$, and $W_3$ respectively correspond to a diameter of a circle or distances defined between two vertices on a major axis of an ellipse. In some embodiments, the first, second, and third memory elements 128a, 128b, 128c may have a shape such as a rectangular prism, a cube, and a cylinder, respectively.

Figure 2C:
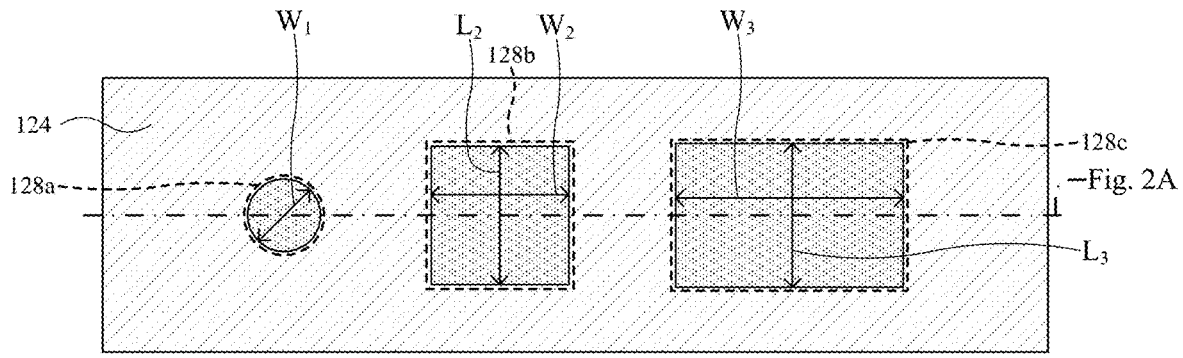

Referring to FIG. 2C, a top view of the memory device 200a of FIG. 2A corresponding to some alternative embodiments of the top view of FIG. 2B as indicated by the cut-away lines shown in FIGS. 2A and 2C is provided. As illustrated in the top view of FIG. 2C, the first memory element 128a has a circular shape, the second memory element 128b has a square shape, and the third memory element 128c has a rectangular shape.

Figure 2D:
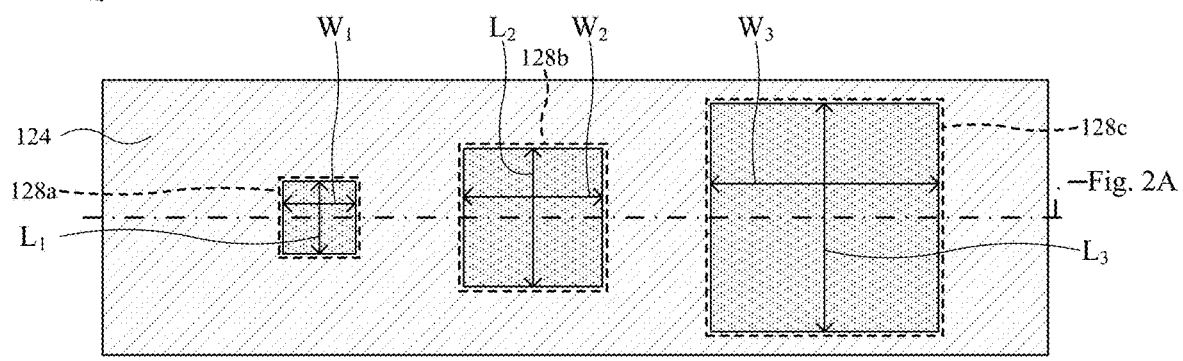

Referring to FIG. 2D, a top view of the memory device 200a of FIG. 2A corresponding to some alternative embodiments of the top view of FIG. 2B as indicated by the cut-away lines shown in FIGS. 2A and 2D is provided. As illustrated in the top view of FIG. 2D, the first, second, and third memory elements 128a, 128b, 128c each have a square shape.

Figure 2E:
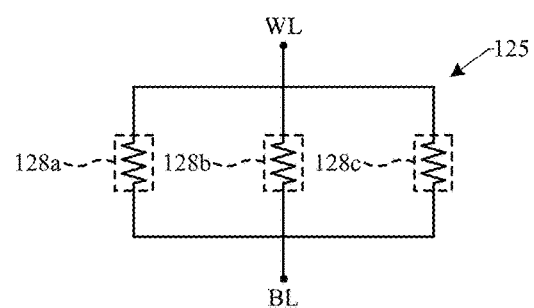
FIG. 2E illustrates a circuit diagram of some embodiments of the memory device of FIG. 2A.

Referring to FIGS. 2E and 2F, some embodiments of a circuit diagram 200e of the memory device 200a of FIG. 2A and some embodiments of a table 200f corresponding to an operation of the circuit diagram 200e is provided.

The circuit diagram 200e represents some embodiments of operating the memory device 200a of FIG. 2A. In some embodiments, the first, second, and third memory elements 128a, 128b, 128c may be represented as resistors with variable resistance that are electrically coupled in parallel with one another. During operation of the circuit diagram 200e a bias voltage may be applied between a bit line (BL) and a word line (WL) to read and/or write the first, second, and/or third memory elements 128a, 128b, 128c. The table 200f represents some embodiments of resistance values of the first, second, and third memory elements 128a, 128b, 128c, resistance values of the memory cell 125, and switching times of the memory cell 125 at different bias voltage values. In some embodiments, the voltage range (first column in table 2000 in the table 200f represents a range of bias voltage values that may be applied to the memory cell 125 to achieve the values in the respective row. It may be appreciated that many different bias voltage ranges, and/or resistance values of the first, second, or third memory elements 128a, 128b, 128c may be used in place of the values in table 200f, thus table 200f is merely a non-limiting example.

In some embodiments, during an operation of the circuit diagram 200e, if the bias voltage is approximately −0.45 V, then the first, second, and third memory elements 128a, 128b, 128c may be reset (e.g., set to a binary state of "0", respectively) to a high resistance state, whereby resistances $R_1$, $R_2$, $R_3$ (of the first, second, and third memory elements 128a, 128b, 128c, respectively) may be approximately 5,000, 3,750, and 2,500 ohms (Ω), respectively and a resistance $R_{total}$ of the memory cell 125 is approximately 1,154 ohms. Further, if the bias voltage is approximately 0.25 V, then the third memory element 128c may be set (e.g., set to a binary state of "1") to a low resistance, whereby the resistance $R_3$ of the third memory element 128c is approximately 1,000 ohms and the resistance $R_{total}$ of the memory cell 125 is approximately 682 ohms. Furthermore, if the bias voltage is approximately 0.35 V, then the second memory element 128b may be set (e.g., set to a binary state of "1") to a low resistance, whereby the resistance $R_2$ of the second memory element 128b is approximately 1,500 ohms and the resistance $R_{total}$ of the memory cell 125 is approximately 536 ohms. Finally, if the bias voltage is approximately 0.45 V, then the third memory element 128c may be set (e.g., set to a binary state of "1") to a low resistance, whereby the resistance $R_3$ of the third memory element 128c is approximately 2,000 ohms and the resistance $R_{total}$ of the memory cell 125 is approximately 462 ohms. Therefore, during the operation of the circuit diagram 200e, the memory cell 125 may achieve 4 resistance states (i.e., 4 weight values) (e.g., 462 ohms, 536 ohms, 682 ohms, or 1,154 ohms) based upon the applied bias voltage.

Figure 3A:
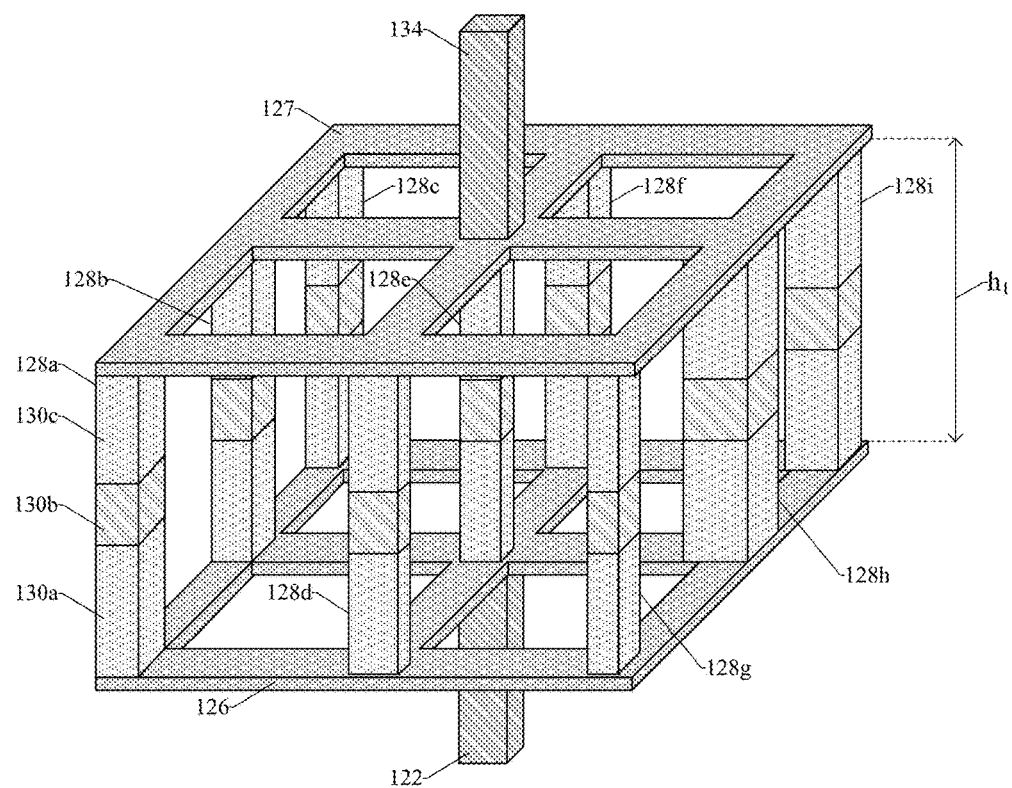
FIG. 3A illustrates a three-dimensional view of some embodiments of a memory device including a memory cell with nine memory elements with different sizes.

Referring to FIG. 3A, a memory device 300a corresponding to some alternative embodiments of the memory device 100a of FIG. 1A in which the memory cell 125 comprises nine memory elements 128a-i is provided.

The memory elements 128a-i comprise the lower ferromagnetic electrode 130a, the tunneling carrier layer 130b, and the upper ferromagnetic electrode 130c, respectively. The memory elements 128a-i each have a height $h_1$. The memory elements 128a-i respectively have areas that are different from one another, such that the memory elements 128a-i respectively have threshold voltages that are different from one another. For example, the memory elements 128a-i have different areas (i.e., a first memory element 128a has a first area, a second memory element 128b has a second area, etc.) that increase in ascending order (i.e., the first area is less than the second area, the second area is less than a third area, etc.), such that threshold voltages of the memory elements $128_{a-i}$ decrease in ascending order (i.e., a first threshold voltage of the first memory element 128a is greater than a second threshold voltage of the second memory element 128b, the second threshold voltage is greater than a third threshold voltage of the third memory element 128c, etc.). Therefore, the threshold voltages of the memory elements $128_{a-i}$ are based on the different areas such that a memory element with a smallest area will have a greatest threshold voltage, whereas a memory element with a largest area will have a smallest threshold voltage. Thus, by varying an area of the memory elements $128_{a-i}$ the memory cell 125 has 10 weight values (i.e., 10 resistive states), thereby increasing a number of weight values in the memory device 300a.

Figure 3B:
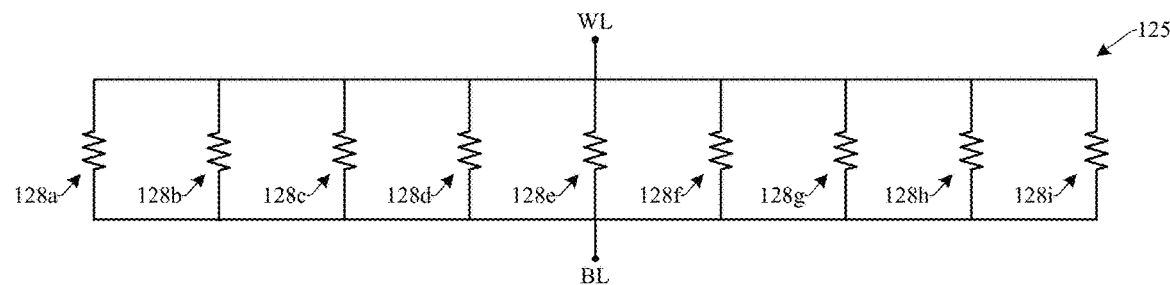
FIG. 3B illustrates a circuit diagram of some embodiments of the memory device of FIG. 3A.

Referring to FIG. 3B, some embodiments of a circuit diagram 300b of the memory device 300a of FIG. 3A is provided.

The circuit diagram 300b represents some embodiments of operating the memory device 300a of FIG. 3A. In some embodiments, the memory elements $128_{a-i}$ may be represented as resistors with a variable resistance that are electrically coupled in parallel with one another. In some embodiments, each memory element $128_{a-i}$ may have two resistive states (e.g., a high resistance state and a low resistance state) such that the resistive values are different from one another. During operation, a bias voltage may be applied between a bit line (BL) and a word line (WL) to read and/or write the memory elements $128_{a-i}$. The bias voltage applied may be used to switch a resistive state of a single memory element in the memory elements $128_{a-i}$. For example, the bias voltage may change a ninth memory element 128i from a high resistive state to a low resistive state while a resistive states of the remaining memory elements $128_{a-h}$ remain unchanged. Thus, a resistance of the memory cell 125 may be changed by changing a resistive state of one or more of the memory elements $128_{a-i}$. Therefore, the memory cell 125 has 10 resistive states (i.e., 10 weight values) that may be achieved by applying voltage biases between the BL and the WL.

Figure 4:
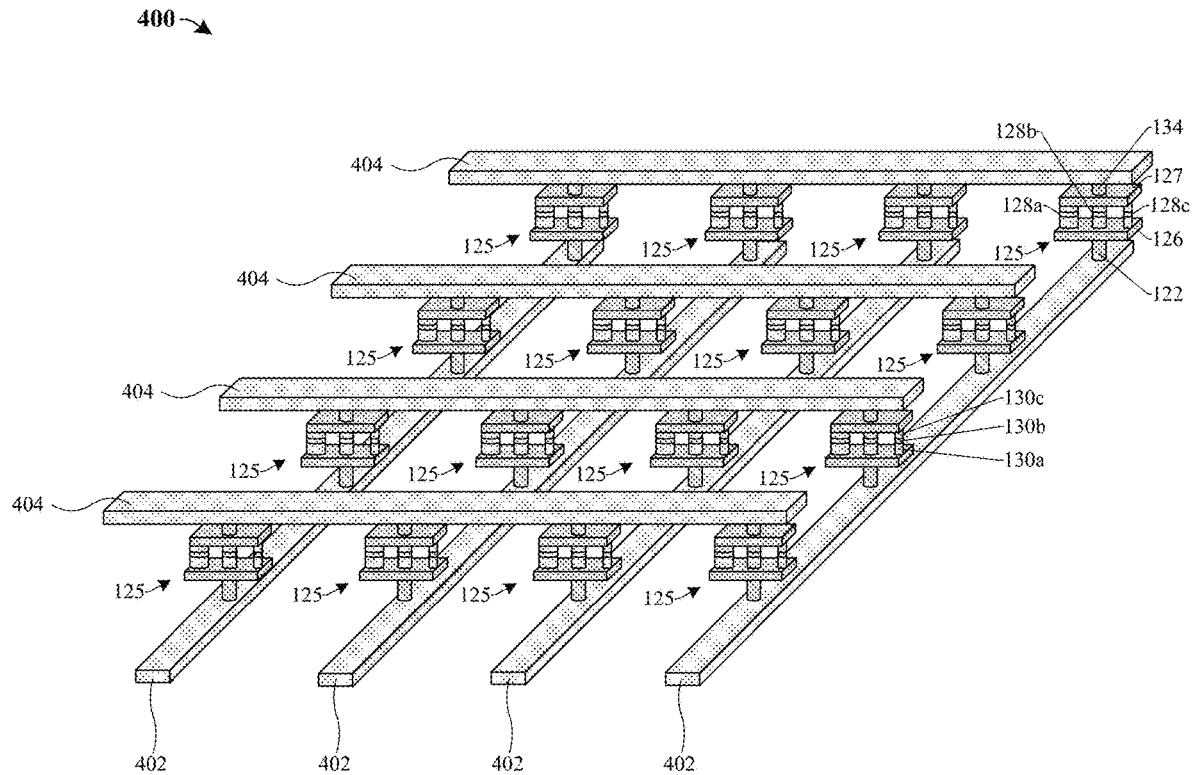
FIG. 4 illustrates a three-dimensional view of some embodiments of a memory device including an array of rows and columns of the memory cell of FIG. 2A.

Referring to FIG. 4, a three-dimensional view of some embodiments of a memory device 400 including an array of rows and columns of the memory cell 125 of FIG. 2A is provided.

The memory device 400 includes a plurality of memory cells 125, a plurality of bit lines 402, and a plurality of word lines 404. The memory cells 125 comprise a plurality of memory elements 128a-c electrically coupled in parallel with one another, such that each memory cell 125 has 4 weight values (i.e., 4 resistive states). The memory cells 125 may, for example, each be as illustrated and described with regard to FIG. 2A. Bit lines 402 extend laterally along corresponding rows of the memory array and electrically couple with memory cells in the corresponding rows, whereas word lines 404 extend laterally along corresponding columns of the memory array and electrically couple with memory cells in the corresponding columns. Thus, a weight value exists between each word line 404 and bit line 402 by way of the memory cells 125. The weight value may be adjusted between each word line 404 and bit line 402 by applying a proper bias voltage to change a resistive state of a corresponding memory cell 125. For example, 4 different weight values may be set between the word lines 404 and bit lines 402, respectively.

In some embodiments, the memory cells 125 may comprise any number of memory elements. For example, the memory cell 125 may comprise N (N is a whole number greater than 1) memory elements, such that the areas of the N memory elements are different from one another, thus the threshold voltages of the N memory elements are different from one another. Therefore, the memory cells 125 may have N+1 weight values respectively. For example, the memory cell 125 may comprise 25 memory elements, such that the memory cell 125 has 26 weight values (i.e., 26 resistive states). Therefore, if a deep neural network was implemented with the memory device 400, N+1 weight values may be set between the word lines 404 and bit lines 402, respectively, thereby increasing an efficiency and accuracy of the deep neural network.

In yet further embodiments, each memory cell 125 in the memory array may be configured to function as synapse function in a deep neural network. For example, each memory cell 125 may function as a connection between two digital neurons such that the number of resistive states of the memory cell 125 corresponds to a synaptic weight between the two digital neurons. The synaptic weight may be used to determine a strength or amplitude of a connection between the two digital neurons. For example, a high resistive state may correspond to a low synaptic weight (i.e., a larger voltage may be used to connect the two digital neurons) and a low resistive state may correspond to a high synaptic weight (i.e., a lower voltage may be used to connect the two digital neurons). Synaptic weights between digital neurons are changed during training of the deep neural networks to achieve a best solution (e.g., based on a cost function of the deep neural network) to a problem. Increasing a number of possible synaptic weight values between two digital neurons may increase a possible number of solutions the deep neural network may generate and/or test. Therefore, increasing the number of possible synaptic weight values (i.e., increasing the number of resistive states of the memory cell 125) between the two digital neurons may increase an efficiency and accuracy of the deep neural network.

Figure 5:
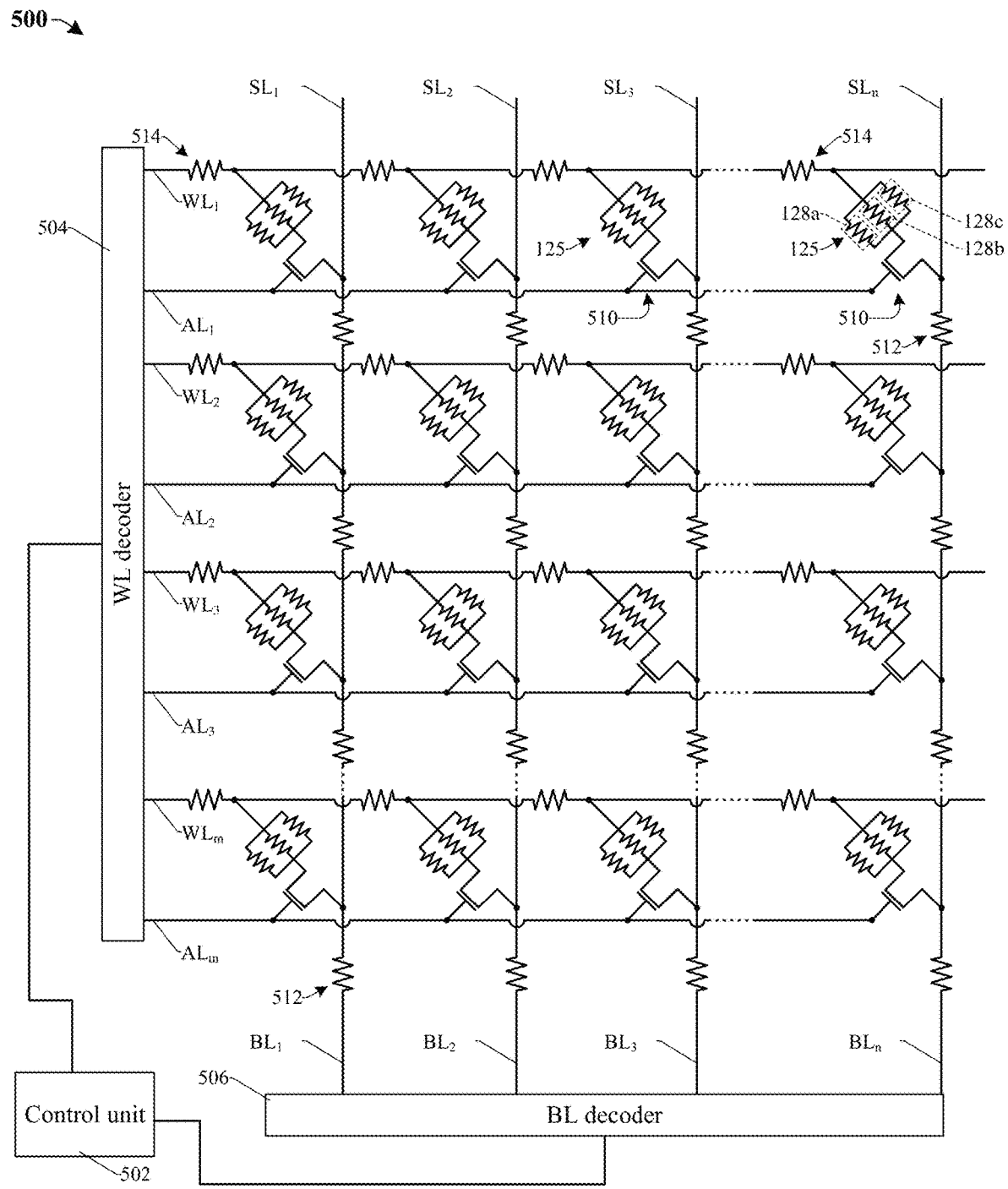
FIG. 5 illustrates a block diagram of some embodiments of the memory device of FIG. 4.

Referring to FIG. 5, a block diagram of some embodiments of a circuit 500 comprising the memory cell of FIG. 2A is provided.

The circuit 500 comprises a plurality of memory cells 125, a plurality of access devices 510, a plurality of bit lines $BL_{1-n}$ (n is an integer), a plurality of source lines $SL_{1-n}$, a plurality of word lines $WL_{1-m}$ (m is an integer), a plurality of access lines $AL_{1-m}$, a word line (WL) decoder 504, a control unit 502, and a bit line (BL) decoder 506. The memory cells 125 may, for example, each be as illustrated and described with regard to FIG. 2A. The memory cells 125 comprise a plurality of memory elements 128a-c electrically coupled in parallel with one another, such that each memory cell 125 has 4 weight values (i.e., 4 resistive states), however any number of weight values is amendable. The plurality of bit lines $BL_{1-n}$ comprise bit line resistances 512, respectively and the plurality of word lines $WL_{1-m}$ comprise word line resistances 514, respectively. The memory cells 125 are arranged within a memory array comprising rows and/or columns. Memory cells 125 within a row of the memory array are operably coupled to a word line $WL_{1-m}$ while memory cells 125 within a column of the memory array are operable coupled to a bit line $BL_{1-n}$. This causes the plurality of memory cells 125 to be respectively associated with an address defined by an intersection of a word line and a bit line. In some embodiments, each memory cell 125 may be linked to a digital neuron within a deep neural network, such that the memory cell 125 sets a weight value of the digital neuron.

The memory array is coupled to support circuitry that is configured to read from and/or write to the plurality of memory cells 125. In some embodiments, the support circuitry comprises the BL decoder 506, the control unit 502, the WL decoder 504, and the plurality of access devices 510 (e.g., transistors, diodes, any combination of the aforementioned, etc.). In some embodiments, the control unit 502 is a microprocessor circuit. In some embodiments, the plurality of access devices 510 is configured as transistors and comprises source/drain regions and a gate electrode, respectively. In some embodiments, the plurality of access lines $AL_{1-m}$ are operably coupled to the gate electrodes of the access devices 510, whereby a voltage applied to an access line $AL_{1-m}$ may control a selectively formed conductive channel between the source/drain regions of an access device 510. The control unit 502 is configured to control the WL decoder 504 and/or the BL decoder 506, for example, the control unit may supply an address (e.g., the address is associated with a single memory cell in the memory array) to the WL decoder 504 and/or the BL decoder 506. The WL decoder 504 is configured to selectively apply a signal (e.g., a current and/or voltage) to one or more of the plurality of word lines $WL_{1-m}$ and to one or more of the plurality of access lines $AL_{1-m}$ based upon the received address. The BL decoder 506 is configured to selectively apply a signal (e.g., a current and/or voltage) to one or more of the plurality of bit lines $BL_{1-n}$ based upon the received address. In some embodiments, the plurality of source lines $SL_{1-n}$ is electrically coupled to support read circuitry such as a multiplexer and/or an amplifier, configured to determine an output of a read operation (not shown). In further embodiments, the support read circuitry is configured to determine a weight value (i.e., a resistive state) of the plurality of memory cells 125.

In some embodiments, the plurality of access lines $AL_{1-m}$ are directly electrically coupled to the control unit 502, such that the control unit 502 may control the plurality of access devices 510 absent the WL decoder 504. In some embodiments, during a read operation of the circuit 500, the control unit 502 is configured to operate the BL decoder 506 to apply a read voltage to one of the plurality of bit lines $BL_{1-n}$ and to concurrently operate the plurality of access devices 510, such that an output of at least one memory cell 125 is present at least one of the source lines $SL_{1-n}$. In some embodiments, during a write operation, the control unit 502 is configured to operate the plurality of access devices 510 by way of the plurality of access lines $AL_{1-m}$ and concurrently operate the WL decoder to a apply a write voltage to at least one of the plurality of word lines $WL_{1-m}$, such that a weight of at least one of the memory cells 125 is set and/or changed.

FIGS. 6-11 illustrates cross-sectional views 600-1100 of some embodiments of a method of forming a memory device according the present disclosure. Although the cross-sectional views 600-1100 shown in FIGS. 6-11 are described with reference to a method, it will be appreciated that the structures shown in FIGS. 6-11 are not limited to the method but rather may stand alone separate of the method. Although FIGS. 6-11 are described as a series of acts, it will be appreciated that these acts are not limited in that the order of the acts can be altered in other embodiments, and the methods disclosed are also applicable to other structures.

Figure 6:
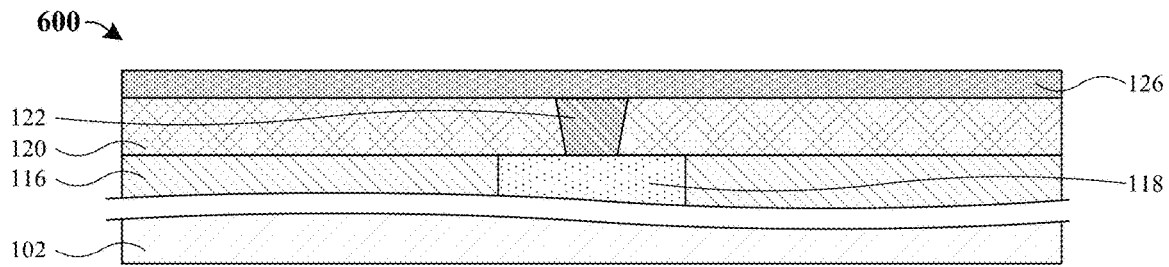
FIGS. 6-11 illustrate cross-sectional views of some embodiments of forming a memory device including a memory cell with three memory elements with different sizes.

As shown in cross-sectional view 600 of FIG. 6, a semiconductor substrate 102 is provided and an inter-level dielectric (ILD) structure 116 is formed over the semiconductor substrate 102. The semiconductor substrate 102 may be, for example, a bulk substrate (e.g., a bulk silicon substrate) or a silicon-on-insulator (SOI) substrate. The ILD structure 116 may, for example, comprise multiple ILD materials such as silicon oxide, silicon nitride, silicon carbide, another suitable dielectric, or the like. An interconnect wire 118 is formed within the ILD structure 116. In some embodiments, the interconnect wire 118 may, for example, be or comprise aluminum, copper, or the like. A dielectric layer 120 is formed over the ILD structure 116 and the interconnect wire 118. In some embodiments, the dielectric layer 120 may, for example, be or comprise silicon nitride, silicon carbide, or the like. A bottom electrode via 122 is formed within the dielectric layer 120 and directly contacts the interconnect wire 118. A bottom electrode 126 is formed over the bottom electrode via 122. The bottom electrode via 122 and the bottom electrode 126 are comprised of conductive material, such as, for example, tungsten, tantalum, titanium, or the like.

Figure 7:
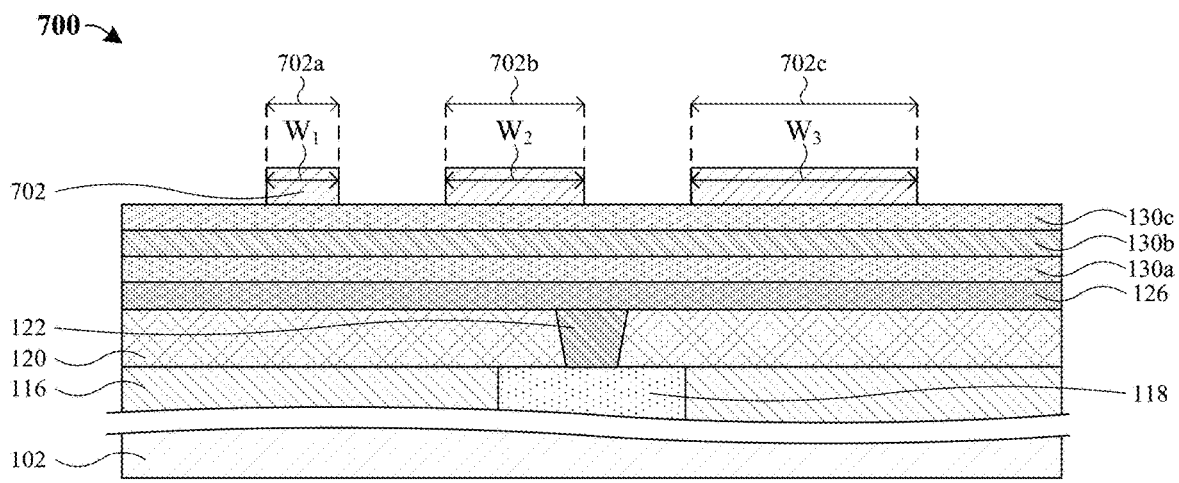

As shown in cross-sectional view 700 of FIG. 7, a stack of memory layers 130a-c is formed over the bottom electrode 126. In some embodiments, the stack of memory layers 130a-c include a lower ferromagnetic electrode 130a and an upper ferromagnetic electrode 130c, which are separated from one another by a tunneling barrier layer 130b. A masking layer 702 is formed over the upper ferromagnetic electrode 130c. The masking layer 702 includes a plurality of masking segments 702a-c having different areas as viewed from a top-view of the masking layer 702. In some embodiments, the plurality of masking segments 702a-c has respective widths $W_1$, $W_2$, $W_3$ that are different from one another. For example, a first width $W_1$ is less than a second width $W_2$ and the second width $W_2$ is less than a third width $W_3$.

In some embodiments, the upper ferromagnetic electrode 130c may, for example, be or comprise iron, cobalt, nickel, iron cobalt, nickel cobalt, cobalt iron boride, iron boride, iron platinum, iron palladium, or the like. In some embodiments, the tunneling barrier layer 130b provides electrical isolation between the upper ferromagnetic electrode 130c and the lower ferromagnetic electrode 130a, while still allowing electrons to tunnel through the tunneling barrier layer 130b under proper conditions. The tunneling barrier layer 130b may, for example, be or comprise magnesium oxide, aluminum oxide (e.g., $Al_2O_3$), nickel oxide, gadolinium oxide, tantalum oxide, molybdenum oxide, titanium oxide, tungsten oxide, or the like. In some embodiments, the lower ferromagnetic electrode 130a may, for example, be or comprise iron, cobalt, nickel, iron cobalt, nickel cobalt, cobalt iron boride, iron boride, iron platinum, iron palladium, or the like.

Figure 8:
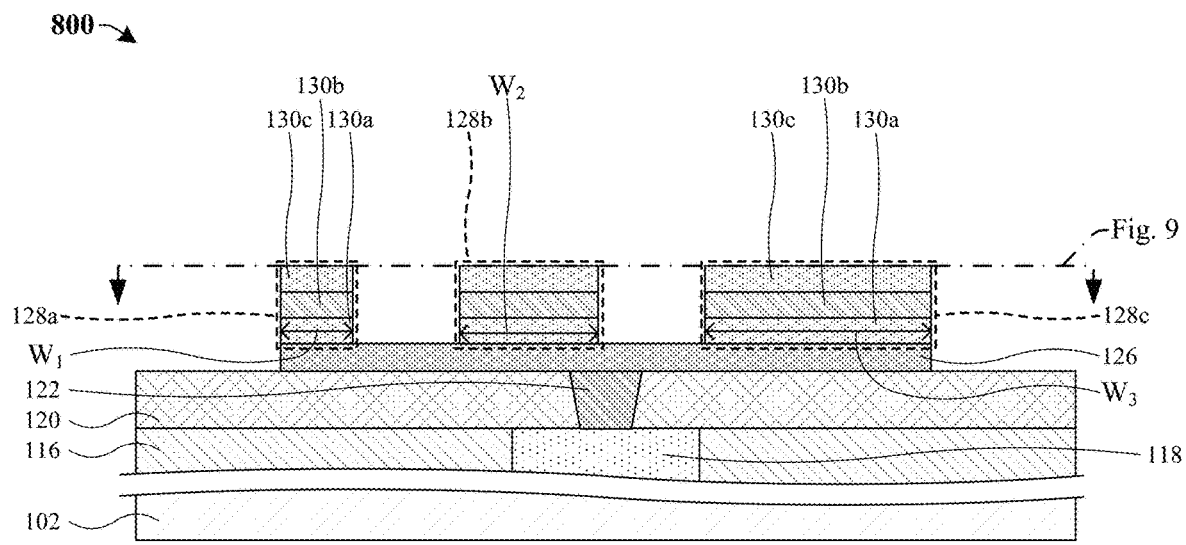

As shown in cross-sectional view 800 of FIG. 8, a removal process is performed on the stack of memory layers 130a-c and the bottom electrode 126 to define memory elements 128a-c having different areas as viewed from a top-view of the memory elements 128a-c. In some embodiments, the memory elements 128a-c have respective widths $W_1$, $W_2$, $W_3$ that are different from one another. For example, a first width $W_1$ is less than a second width $W_2$ and the second width $W_2$ is less than a third width $W_3$. In some embodiments, the widths $W_1$, $W_2$, $W_3$ of the memory elements 128a-c are lithographically defined such that the memory elements 128a-c have different threshold voltages from one another. In some embodiments, the widths $W_1$, $W_2$, $W_3$ of the memory elements 128a-c are substantially equal to the widths $W_1$, $W_2$, $W_3$ of the plurality of masking segments (702a-c of FIG. 7). In some embodiments, the removal process includes exposing an unmasked portion of the stack of memory layers 130a-c and the bottom electrode 126 to an etchant, removing the masking layer 702, and performing a planarization process (e.g., a chemical mechanical planarization (CMP) process) on the upper ferromagnetic electrode 130c. In some embodiments, the removal process includes utilizing a selectivity etch process.

Figure 9:
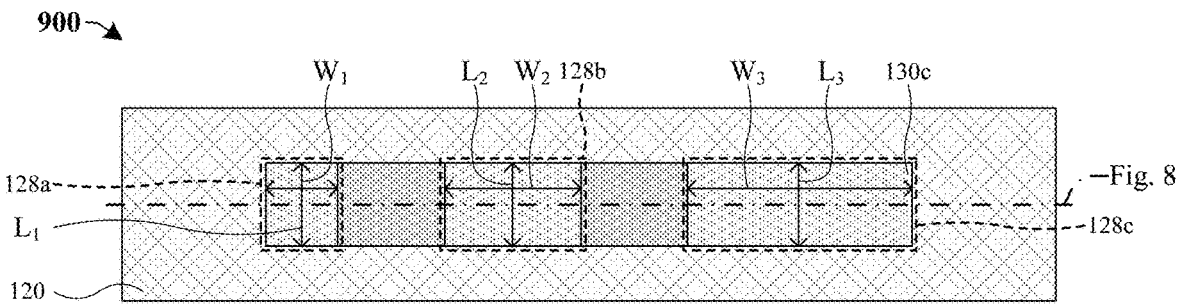

Referring to FIG. 9, some embodiments of a top view of the cross-sectional view 800 of FIG. 8 as indicated by the cut-away lines shown in FIGS. 8 and 9 is provided. The memory elements 128a-s have respective lengths $L_1$, $L_2$, $L_3$. In some embodiments, the lengths $L_1$, $L_2$, $L_3$ are substantially equal to one another. The memory elements 128a-c have respective areas $A_1$, $A_2$, $A_3$, such that the areas $A_1$, $A_2$, $A_3$ are based upon the lengths $L_1$, $L_2$, $L_3$ and widths $W_1$, $W_2$, $W_3$, respectively. For example, a first area $A_1$ of a first memory element 128a is equal to a first width $W_1$ times a first length $L_1$, thus the areas $A_1$, $A_2$, $A_3$ are different from one another.

As shown in cross-sectional view 1000, a first inter-metal dielectric (IMD) structure 124 is formed over the dielectric layer 120. The first IMD structure 124 may, for example, comprise multiple IMD materials such as silicon oxide, silicon nitride, silicon carbide, another suitable dielectric, or the like. A top electrode 127 is subsequently formed within the first IMD structure 124 and over the memory elements 128a-c defining a memory cell 125. In some embodiments, the top electrode 127 may, for example, be or comprise tungsten, tantalum, titanium, or the like. In some embodiments, the top electrode 127 may be formed by selectively etching the first IMD structure to form a trench overlying the memory elements 128a-128c. A conductive material is subsequently formed within the trench. In some embodiments, the top electrode 127 may vertically extend below a top of the memory elements 128a-c. In some embodiments, the top electrode 127 may laterally extend past opposing outermost sidewall of the first memory element 128a or the third memory element 128c.

As shown in cross-sectional view 1100, a second IMD structure 132 is formed over the top electrode 127. A top electrode via 134 is formed over the top electrode 127 and extends through the second IMD structure 132. A conductive wire 136 is formed over the top electrode via 134. The second IMD structure 132 may, for example, comprise multiple IMD materials such as silicon oxide, silicon nitride, silicon carbide, another suitable dielectric, or the like. In some embodiments, the top electrode via 134 may, for example, be or comprise tungsten, tantalum, titanium, or the like. In some embodiments, the conductive wire 136 may, for example, be or comprise aluminum copper, aluminum, copper, or the like.

FIGS. 6-11 illustrate some embodiments of a method of forming a memory device including a memory cell with three memory elements with different sizes. It may be appreciated that in some embodiments, the method outlined in FIGS. 6-11 may, for example, be used to form a memory device with N memory elements (N is a positive whole number greater than 1) electrically coupled in parallel with one another. In some embodiments, the method used to form the memory device with N memory elements utilizes a single masking layer and a single etch process to define a memory cell with N+1 weight values (not shown).

Figure 12:
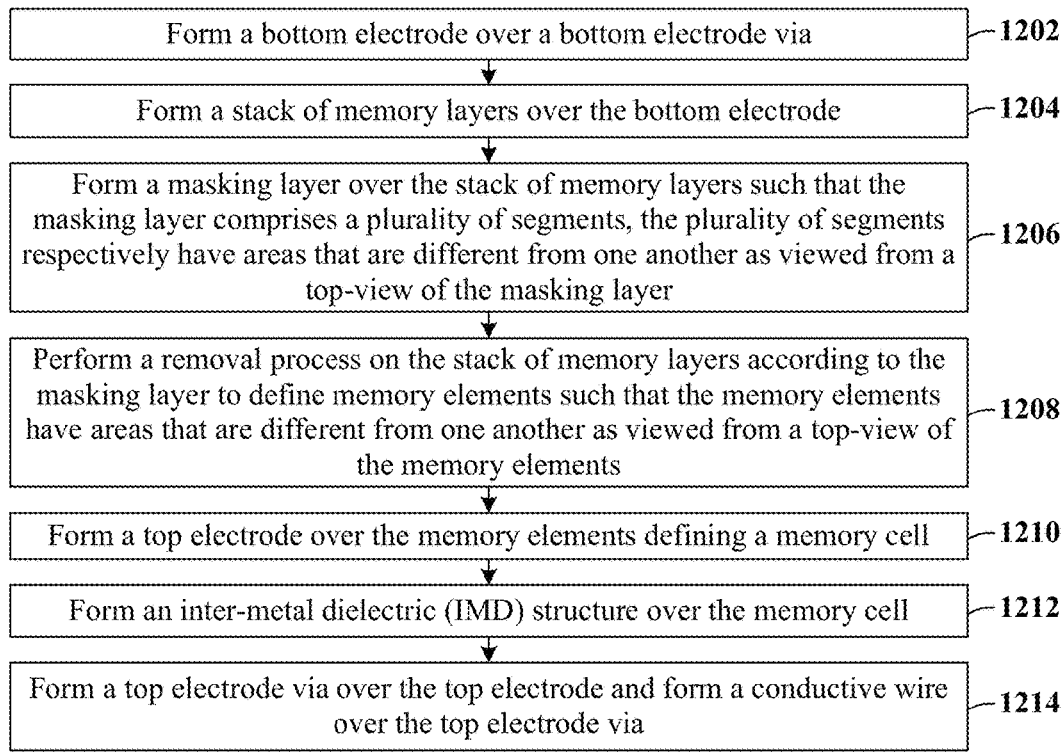
FIG. 12 illustrates a methodology in flowchart format that illustrates some embodiments of a method of forming a memory device.

FIG. 12 illustrates a method 1200 of forming a memory device in accordance with some embodiments. The memory device includes a memory cell configured to have three or more distinct resistances corresponding to different synaptic weights of a neuromorphic computing system.

Although the method 1200 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At 1202, a bottom electrode is formed over a bottom electrode via. FIG. 6 illustrates a cross-sectional view 600 corresponding to some embodiments of act 1202.

At 1204, a stack of memory layers is formed over the bottom electrode. FIG. 7 illustrates a cross-sectional view 700 corresponding to some embodiments of act 1204.

At 1206, a masking layer is formed over the stack of memory layers such that the masking layer comprises a plurality of segments. The plurality of segments respectively has areas that are different from one another as viewed from a top-view of the masking layer. FIG. 7 illustrates a cross-sectional view 700 corresponding to some embodiments of act 1206.

At 1208, a removal process is performed on the stack of memory layers according to the masking layer to define memory elements such that the memory elements have areas that are different from one another as viewed from a top-view of the memory elements. FIGS. 8 and 9 illustrate a cross-sectional view 800 and a top view 900 corresponding to some embodiments of act 1208.

Figure 10:
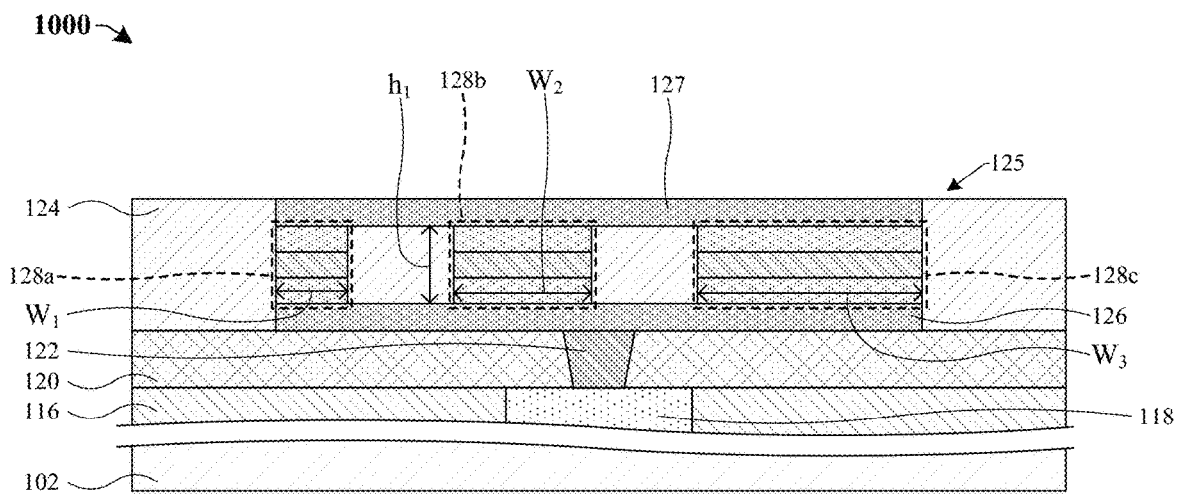

At 1210, a top electrode is formed over the memory elements defining a memory cell. FIG. 10 illustrates a cross-sectional view 1000 corresponding to some embodiments of act 1210.

Figure 11:
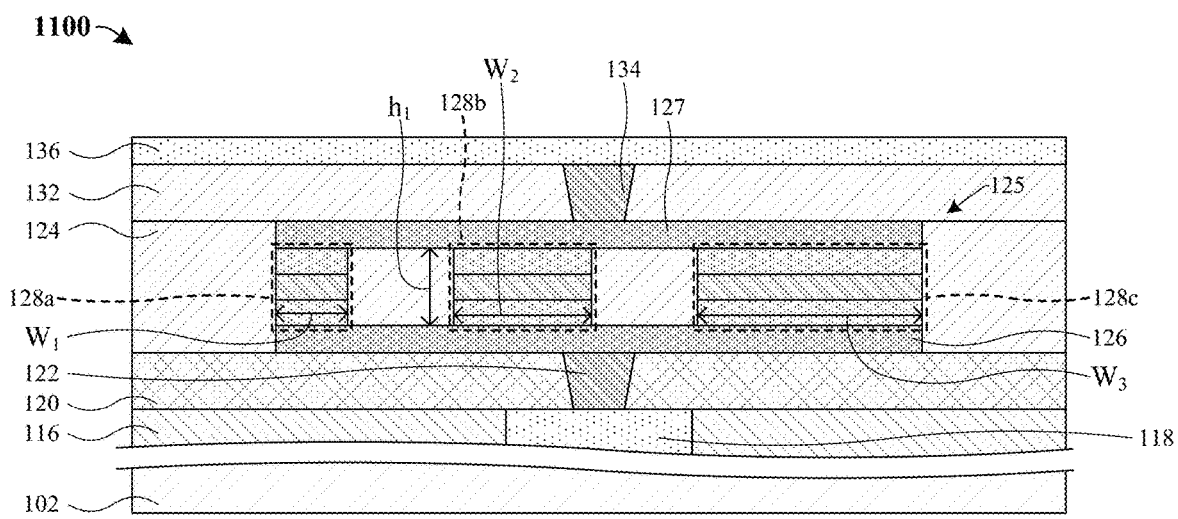

At 1212, an inter-metal dielectric (IMD) structure is formed over the memory cell. FIG. 11 illustrates a cross-sectional view 1100 corresponding to some embodiments of act 1212.

At 1214, a top electrode via is formed over the top electrode and a conductive wire is formed over the top electrode via. FIG. 11 illustrates a cross-sectional view 1100 corresponding to some embodiments of act 1214.

Accordingly, in some embodiments, the present disclosure relates to a method of forming a memory cell with N+1 weight values (i.e., N+1 resistance values) that includes performing a single etch process on a stack of memory layers according to a masking layer to define N memory elements. The N memory elements respectively comprise different areas (the N memory elements have a same height) such that the N memory elements have threshold voltages different from one another.

In some embodiments, the present application provides a memory device, including a substrate; a bottom electrode disposed over the substrate; a first memory element disposed between the bottom electrode and a top electrode, wherein the first memory element has a first area; and a second memory element disposed between the bottom electrode and the top electrode, the second memory element is laterally separated from the first memory element by a non-zero distance, and wherein the second memory element has a second area different than the first area.

In some embodiments, the present application provides a memory device, including a semiconductor substrate; a bottom electrode disposed over the semiconductor substrate; a first memory element disposed over the bottom electrode; a second memory element disposed over the bottom electrode and adjacent to the first memory element; a top electrode disposed over the first and second memory elements; and wherein the first and second memory elements are electrically coupled in parallel between the top and bottom electrodes, and wherein the first memory element has a first threshold voltage greater than a second threshold voltage of the second memory element.

In some embodiments, the present application provides a method for forming a memory device, the method including forming a stack of memory layers over a semiconductor substrate; forming a masking layer over the stack of memory layers; performing a removal process on the stack of memory layers according to the masking layer to define a plurality of memory elements, wherein the plurality of memory elements respectively have different areas as viewed from a top-view of the plurality of memory elements; and forming a top electrode over the plurality of memory elements.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
    a substrate;
    a bottom electrode disposed over the substrate;
    a first memory element disposed between the bottom electrode and a top electrode, wherein the first memory element has a first area;
    a second memory element disposed between the bottom electrode and the top electrode, the second memory element is laterally separated from the first memory element by a non-zero distance, and wherein the second memory element has a second area different than the first area; and
    a third memory element disposed between the bottom electrode and the top electrode, wherein the second memory element is spaced laterally between the first memory element and the third memory element, wherein the first memory element, the second memory element, and the third memory element respectively have a first shape when viewed in cross-section, and wherein the first memory element, the second memory element, and the third memory element each have different shapes from one another when viewed from a top-view.

2. The memory device of claim 1, wherein the first memory element has a first threshold voltage different than a second threshold voltage of the second memory element.

3. The memory device of claim 1,
    wherein the bottom electrode continuously extends from directly below a bottom surface of the first memory element to directly below a bottom surface of the second memory element; and
    wherein the top electrode continuously extends from directly above a top surface of the first memory element to directly above a top surface of the second memory element.

4. The memory device of claim 3, wherein the bottom surface of the first memory element is vertically aligned with the bottom surface of the second memory element, wherein the top surface of the first memory element is vertically aligned with the top surface of the second memory element.

5. The memory device of claim 1, wherein the first shape is rectangular, wherein the first memory element has a circular shape when viewed from the top-view, the second memory element has a square shape when viewed from the top-view, and the third memory element has a rectangular shape when viewed from the top-view.

6. The memory device of claim 1, wherein when viewed from the top-view an outer perimeter of the first memory element is spaced laterally between opposing sidewalls of the second memory element.

7. The memory device of claim 1, wherein the first and second memory elements are configured as spin-transfer torque magnetoresistive random-access memory (STT-MRAM) cells, respectively.

8. The memory device of claim 1, wherein the first and second memory elements have different widths extending along a first direction, a same length extending along a second direction that is perpendicular to the first direction and that is parallel to an upper surface of the substrate.

9. A memory device, comprising:
a semiconductor substrate;
a bottom electrode disposed over the semiconductor substrate;
a first memory element disposed over the bottom electrode;
a second memory element disposed over the bottom electrode and adjacent to the first memory element;
a top electrode disposed over the first and second memory elements; and
wherein the first and second memory elements are electrically coupled in parallel between the top and bottom electrodes, wherein the first memory element has a first threshold voltage greater than a second threshold voltage of the second memory element, wherein an outer sidewall of the first memory element is aligned with a first outer sidewall of the top electrode and an outer sidewall of the second memory element is aligned with a second outer sidewall of the top electrode, and wherein a first outer sidewall of the bottom electrode is aligned with the outer sidewall of the first memory element and a second outer sidewall of the bottom electrode is aligned with the outer sidewall of the second memory element, and wherein a top surface of the bottom electrode continuously extends from the first outer sidewall of the bottom electrode to the second outer sidewall of the bottom electrode.

10. The memory device of claim 9, wherein when viewed from a top-view the first memory element has a first area less than a second area of the second memory element.

11. The memory device of claim 10, wherein the first and second memory elements have a same height.

12. The memory device of claim 9, further comprising:
an access device electrically coupled to the bottom electrode and configured to apply a bias voltage to the first memory element and the second memory element.

13. The memory device of claim 9, further comprising:
a third memory element, wherein the third memory element has a third threshold voltage less than the second threshold voltage.

14. The memory device of claim 13, wherein the first, second, and third memory elements are configured as spin-transfer torque magnetoresistive random-access memory (STT-MRAM) cells, respectively.

15. The memory device of claim 9, wherein the first and second memory elements have maximum resistance values different from one another.

16. The memory device of claim 9, wherein a single bottom surface of the top electrode continuously extends from the first outer sidewall of the top electrode to the second outer sidewall of the top electrode, and wherein the single bottom surface of the top electrode directly contacts a top surface of the first memory element and directly contacts a top surface of the second memory element.

17. The memory device of claim 9, wherein the first and second memory elements comprise a same stack of memory layers.

18. The memory device of claim 9, further comprising:
a third memory element disposed laterally between the first memory element and the second memory element, wherein the third memory element directly contacts the top surface of the bottom electrode and a bottom surface of the top electrode.

19. A method for forming a memory device, the method comprising:
forming a bottom electrode over a semiconductor substrate;
forming a stack of memory layers over the semiconductor substrate;
forming a masking layer over the stack of memory layers;
performing a removal process on the stack of memory layers and the bottom electrode according to the masking layer to define a plurality of memory elements, wherein the plurality of memory elements respectively have different areas as viewed from a top-view of the plurality of memory elements, wherein the plurality of memory elements comprises a first memory element and a second memory element, wherein a first outer sidewall of the bottom electrode is aligned with a sidewall of the first memory element and a second outer sidewall of the bottom electrode is aligned with a sidewall of the second memory element, and wherein a top surface of the bottom electrode continuously extends from the first outer sidewall to the second outer sidewall; and
forming a top electrode over the plurality of memory elements, wherein a first outer sidewall of the top electrode is aligned with the first outer sidewall of the bottom electrode and a second outer sidewall of the top electrode is aligned with the second outer sidewall of the bottom electrode.

20. The method of claim 19, wherein the masking layer comprises a plurality of segments with widths that are different from one another.

* * * * *